United States Patent [19]
En et al.

[11] Patent Number: 5,956,610
[45] Date of Patent: Sep. 21, 1999

[54] METHOD AND SYSTEM FOR PROVIDING ELECTRICAL INSULATION FOR LOCAL INTERCONNECT IN A LOGIC CIRCUIT

[75] Inventors: William George En, Sunnyvale; Sunil Mehta; Fei Wang, both of San Jose; Stewart Gordon Logie, Campbell, all of Calif.

[73] Assignee: Advanced Micro Devices, Inc., Sunnyvale, Calif.

[21] Appl. No.: 08/861,897

[22] Filed: May 22, 1997

[51] Int. Cl.[6] .............................................. H01L 21/4763
[52] U.S. Cl. ........................ 438/630; 438/637; 438/639
[58] Field of Search ................................. 438/738, 744, 438/721, 699, 696, 624, 625, 639, 637, 622, 630, 454

[56] References Cited

U.S. PATENT DOCUMENTS

| | | | |
|---|---|---|---|
| 5,294,295 | 3/1994 | Gabriel | 156/657 |
| 5,340,774 | 8/1994 | Yen | 437/240 |
| 5,480,814 | 1/1996 | Wuu et al. | 437/41 |
| 5,624,874 | 4/1997 | Lim et al. | 438/653 |
| 5,635,426 | 6/1997 | Hayashi et al. | 438/453 |
| 5,668,065 | 9/1997 | Lin | 438/303 |
| 5,677,249 | 10/1997 | Fukui et al. | 437/41 |
| 5,683,922 | 11/1997 | Jeng et al. | 437/41 |

OTHER PUBLICATIONS

Wolf, Stanley "Silicon Processing For The VLSI Era, vol. 3: The Submicron MOSFET", Lattice Press, pp. 648–661, 1995.

*Primary Examiner*—Richard A. Booth
*Assistant Examiner*—Michael S. Lebentritt
*Attorney, Agent, or Firm*—Sawyer & Associates

[57] ABSTRACT

The present invention provides a method and system for providing electrical insulation for local interconnect in a logic circuit. A system and method according to the present invention for providing electrical installation for local interconnects during manufacturing of a logic circuit comprising the steps of providing a first layer of material over a semiconductor wafer and providing a second layer of material over the first layer. Additionally, a photoresist material is provided over a portion of the logic circuit to be electrically insulated. Portions of the first and second layers which are unprotected by the photoresist material are then etched. At least a third layer is then provided over the first and second layers, and the third layer is etched such that the first layer as an electrical insulation over the portion of the logic circuit.

9 Claims, 6 Drawing Sheets

METHOD AND SYSTEM FOR PROVIDING ELECTRICAL INSULATION FOR LOCAL INTERCONNECT IN A LOGIC CIRCUIT

FIELD OF THE INVENTION

The present invention relates generally to logic circuits, and more particularly, to a system and method for providing electrical insulation for local interconnect in a logic circuit.

BACKGROUND OF THE INVENTION

As logic circuits become progressively smaller, the logic circuit architecture is typically such that it is common for electrical interconnects between point A and point B within a logic circuit to run through or over point C of the logic circuit, thus causing an unintended electrical connection to point C. A common way to avoid this problem is to route the interconnect around point C to avoid an unintended electrical connection. This routing around point C requires a longer connection than directly connecting point A to point B.

Accordingly, what is needed is a method and system for providing electrical insulation for local interconnects in a logic circuit which facilitates a direct electrical connection between two points in a logic circuit without unwanted electrical connections to other points in the logic circuit. The present invention addresses such a need.

SUMMARY OF THE INVENTION

The present invention provides a method and system for providing electrical insulation for local interconnect in a logic circuit. A system and method according to the present invention for providing electrical insulation for local interconnects during manufacturing of a logic circuit comprises the steps of providing a first layer of material over a semiconductor wafer and providing a second layer of material over the first layer. Additionally, a photoresist material is provided over a portion of the logic circuit to be electrically insulated. Portions of the first and second layers which are unprotected by the photoresist material are then etched. At least a third layer is then provided over the first and second layers, and the third layer is etched such that the first layer has an electrical insulation over the portion of the logic circuit.

The first layer remains in position to act as an electrical insulator over the portion of the logic circuit which is desired to be insulated. Consequently, a direct connection between two points of the logic circuit can be made since items between the two points are insulated. By allowing direct connection between two points, a highly efficient logic circuit can be produced.

DESCRIPTION OF THE INVENTION

The present invention relates to a system and method for providing electrical insulation for local interconnects during fabrication of a logic circuit. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
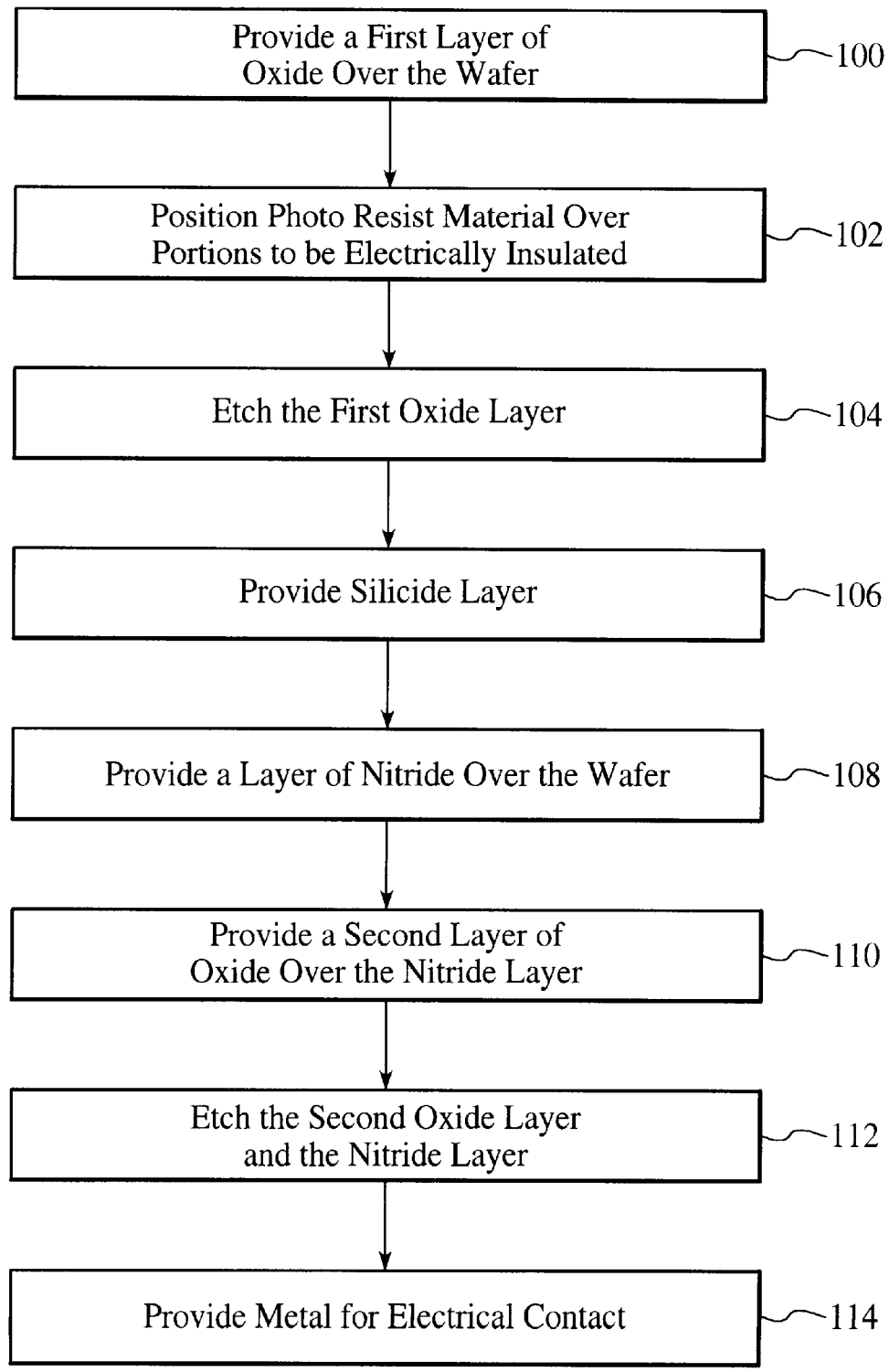
FIG. 1 is a flow diagram of a conventional method for manufacturing a logic circuit.

FIG. 1 is a flow diagram of a conventional method for fabricating a logic circuit. A first layer of oxide is provided over the semiconductor wafer of the logic circuit via step 100. A photoresist material is then positioned over portions to be electrically insulated, via step 102. The first oxide layer is then etched via step 104. A silicide layer is then provided via step 106. The silicide layer enhances electrical connections. A layer of nitride is then typically provided over the wafer via step 108. A second layer of oxide is then provided over the nitride layer via step 110. The second oxide layer and the nitride layer are then etched via step 112. Metal, such as tungsten, is then provided for electrical contact via step 114.

Figure 2A:
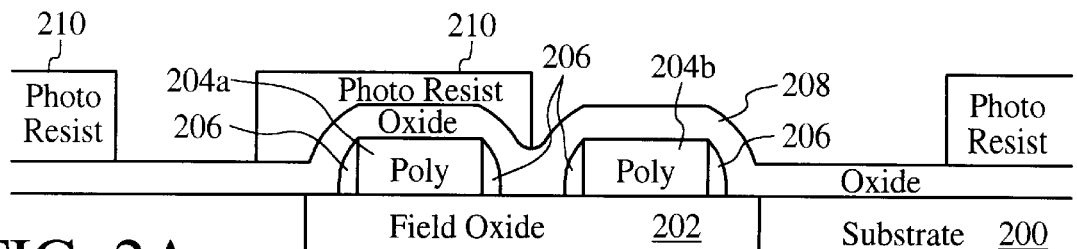
FIGS. 2A–2E illustrate a problem with the conventional method for fabricating a logic circuit if an attempt was made to create a direct connection between two points with an unrelated poly located between the two points.

FIGS. 2A–2E illustrate a problem with the conventional methods described in FIG. 1 if an attempt was made to create a direct connection between two points with an unrelated poly located between the two points. FIG. 2A shows a wafer with a substrate 200 with a field oxide 202. A poly 204A which is desired to be electrically insulated is shown next to a poly 204B which is desired to be electrically connected. Spacers 206 are shown next to each poly 204A–B and a layer of oxide 208 has been provided over the wafer. Additionally, photoresist material 210 is shown to cover portions of the wafer including the poly 204A which is desired to be electrically insulated.

Figure 2B:
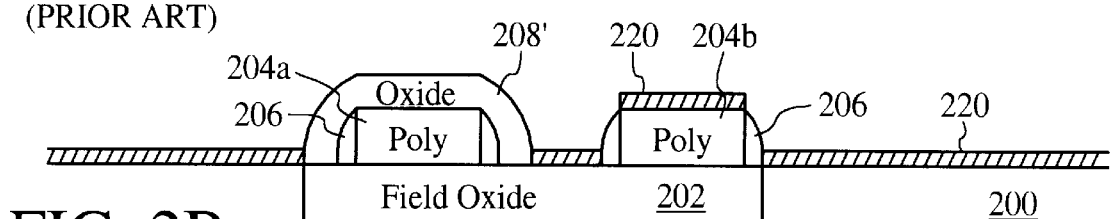

FIG. 2B shows the wafer of FIG. 2A after the first oxide layer 208 has been etched and the photoresist 210 has been removed, leaving the first oxide layer 208 primed. Additionally, the silicide layer 220 has been provided over the wafer.

Figure 2C:
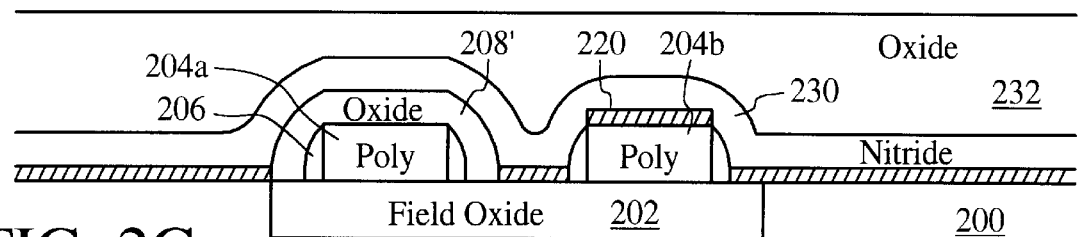

In FIG. 2C, a nitride layer 230 has been provided over the wafer shown in FIG. 2B. Additionally, a second layer of oxide 232 is shown above the nitride layer 230.

Figure 2D:
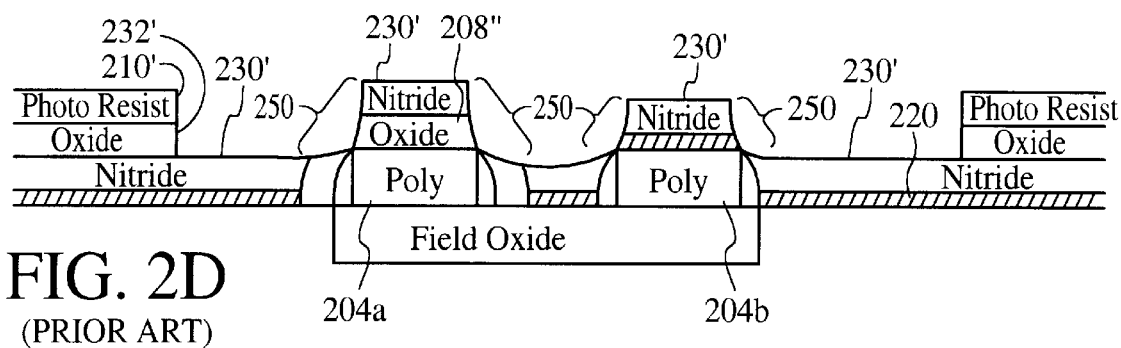

FIG. 2D shows the wafer of FIG. 2C during the etch of the second oxide layer and the nitride layer. During this etch, areas 250 are typically etched away faster than other areas of the wafer due to the curvature of the surface. Thus, areas 250 are typically etched in a curved shape and portions of the thin oxide layer 208" are typically etched away along with the nitride 230'.

Figure 2E:
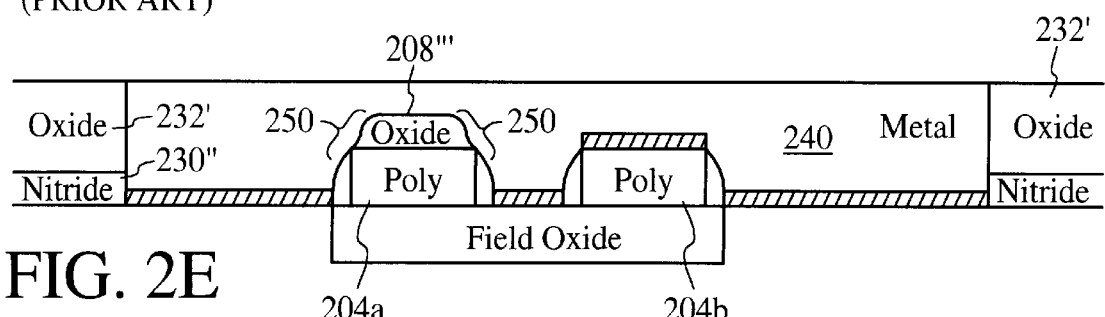

FIG. 2E shows the resulting wafer after the etching of the second oxide layer and the nitride layer. As can be seen in FIG. 2E, portions of the oxide layer 208''' have been etched away, as shown by area 250. When metal 240, such as tungsten, is provided for electrical contact, the poly 204A which is desired to be electrically insulated, will typically be electrically connected along with poly 204B which was originally intended to be electrically connected.

Figure 3:
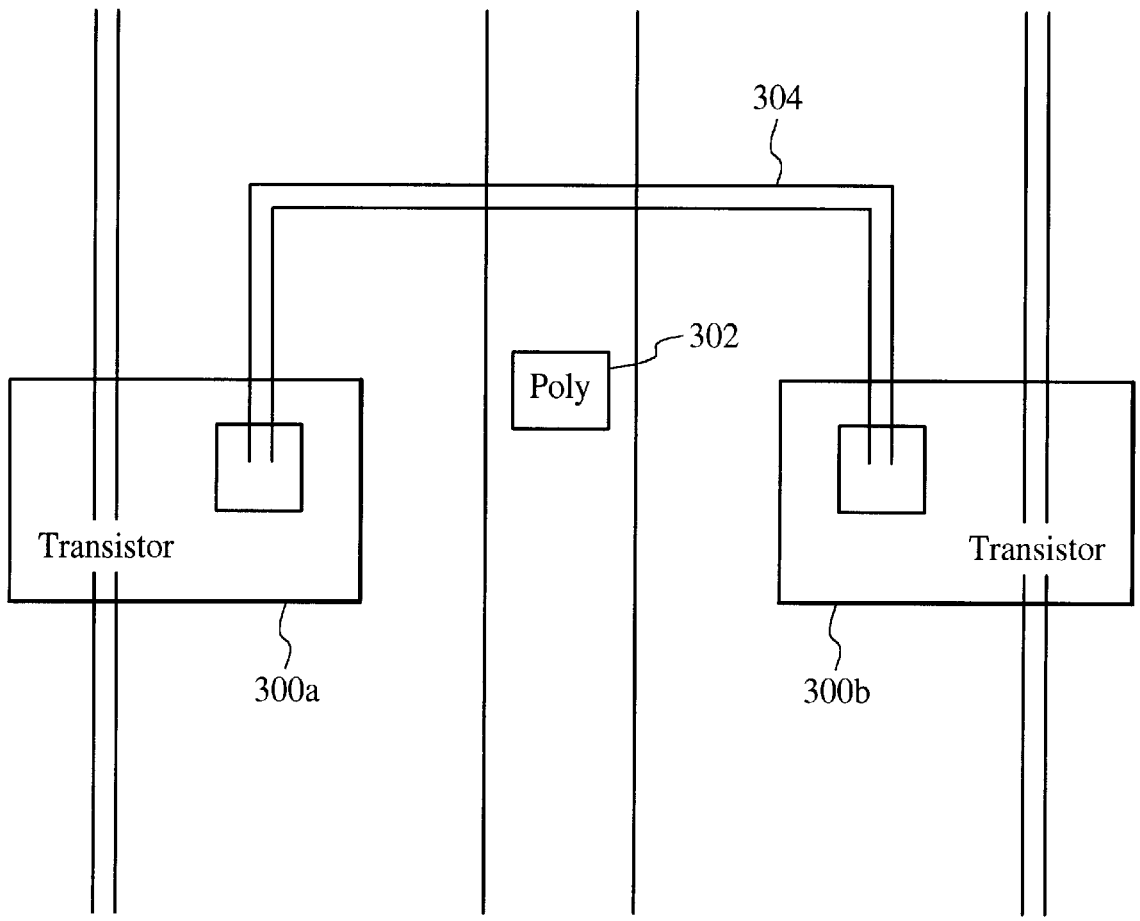
FIG. 3 is a block diagram illustrating a conventional interconnect architecture for a logic circuit.

FIG. 3 shows a conventional interconnect utilized in logic circuits to avoid the problem of unintentional electrical connections as shown in FIG. 2E. The example shown in FIG. 3 shows transistors 300A and 300B to be electrically connected to avoid electrically connecting poly 302, the interconnect 304 is typically routed around the object located between the two points to be connected within the logic circuit. Consequently, the interconnect 304 is typically longer than it would have been for a direct connection between the transistors 300A and 300B. A direct connection is herein meant to describe a connection which does not route itself around an object which is not intended to be electrically connected.

What is needed is a system and method for providing electrical insulation for local connects which allows for direct electrical connection between two points in a logic circuit. Such a system and method would be especially useful in the switch matrix region of a programmable logic device. The present invention address such a need.

Figure 4:
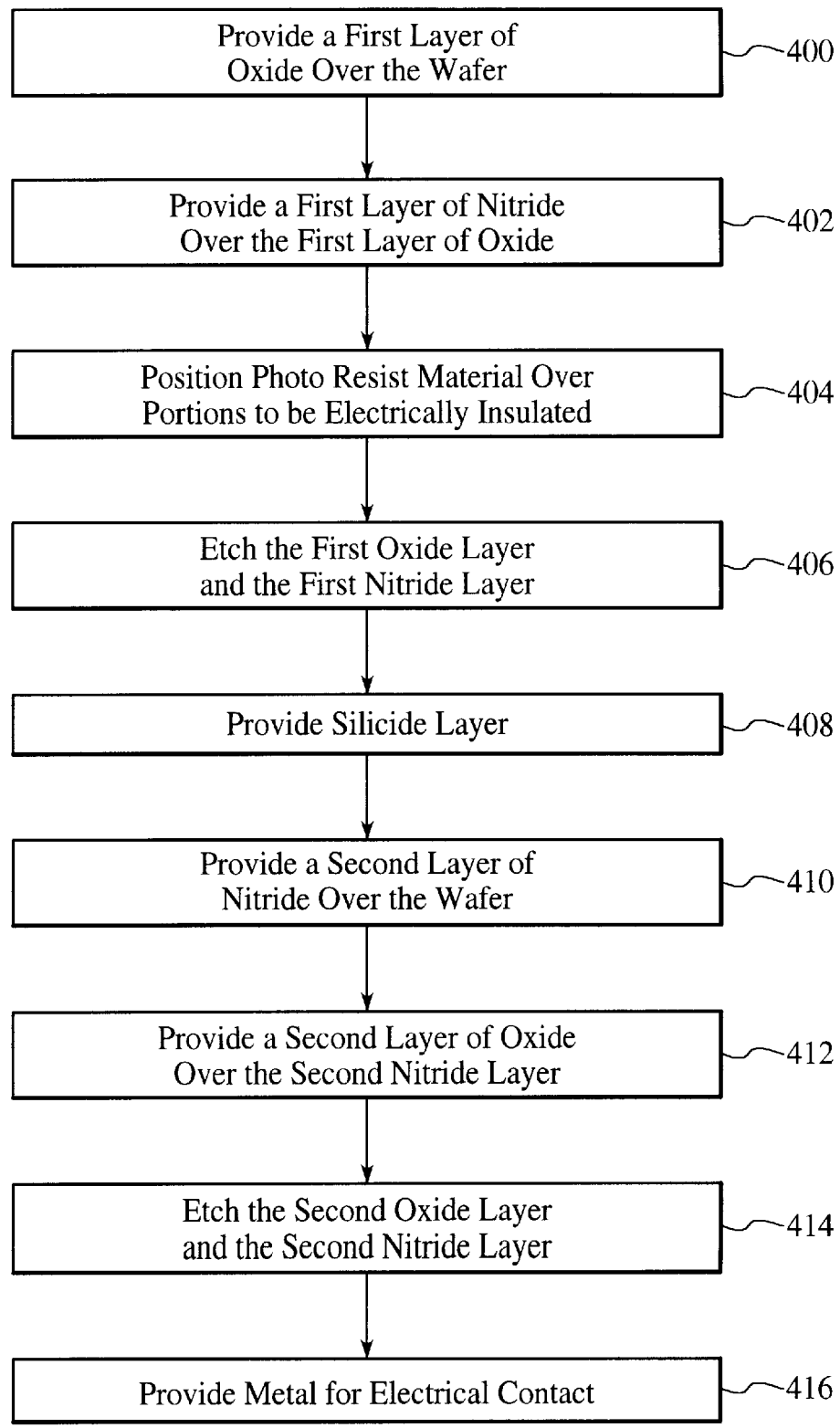
FIG. 4 is a flow diagram of a method according to the present invention.

FIG. 4 is a flow diagram of a method according to the present invention. A first layer of oxide is provided over the wafer of the logic circuit via step 400. A first layer of nitride is then provided over the first layer of oxide, via step 402. Photoresist material is then positioned over portions of the logic circuit to be electrically insulated via step 404. The first oxide layer and the first nitride layer are then etched via step 406. A silicide layer is then provided via step 408, and a second layer of nitride is provided over the wafer via step 410. A second layer of oxide of is then provided over the second nitride layer via step 412. The second oxide layer and the second nitride layer are then etched via step 414. Finally, metal is provided for electrical contact via step 416.

FIGS. 5A–5E illustrate the method according to the present invention for providing electrical insulation for local interconnects during fabrication of a logic circuit.

Figure 5A:
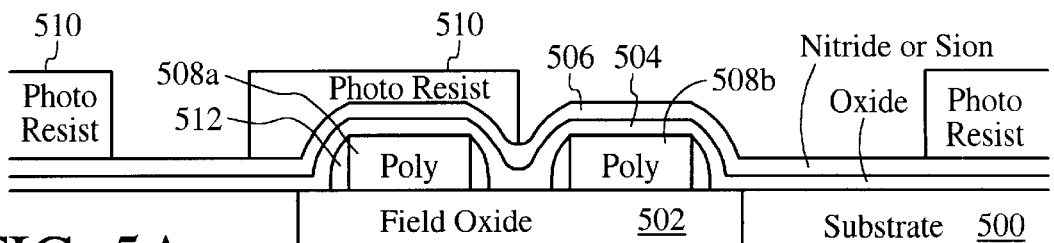
FIGS. 5A–5E illustrate the method according to the present invention for providing electrical insulation for local interconnects during fabrication of a logic circuit.

FIG. 5A shows a wafer for a logic circuit including a substrate 500 and a field oxide 502. A poly 508A, which is intended to be insulated from electrical connection, is shown next to a poly 508B which is intended to be electrically connected. Positioned next to each poly, are spacers 512. Additionally, an oxide layer 504 is shown over the wafer. This oxide layer is preferably approximately 200 angstroms thick, however, it can range from approximately 200 angstroms to 1000 angstroms. A nitride layer 506 is shown above the oxide layer 504. This nitride layer 506 is preferred to be approximately 350 angstroms thick, however, the thickness of the nitride layer 506 can range from approximately 200 angstroms to 2000 angstroms. The preferred thickness of the combined layer of nitride 506 and oxide layer 504 is approximately equivalent to the first oxide layer 208 of the conventional method and system shown in FIG. 2A which is approximately 550 angstroms.

Another material such as silicone oxynitride (SION) can be used in place of nitride for a layer 506.

A photoresist material 510 is shown to be placed over portions of the wafer, including areas in which electrical insulation is desired, such as over the poly 508A.

Figure 5B:
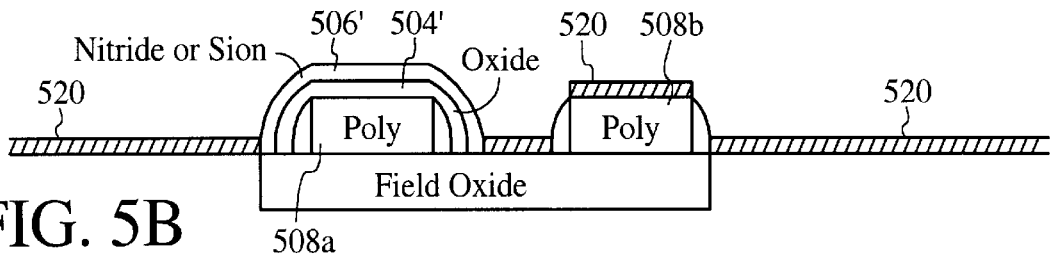

FIG. 5B shows the wafer of FIG. 5A after the nitride layer 506 and oxide layer 504 have been etched and the photoresist material 510 has been removed. The etching of the nitride layer 506 and the oxide layer 504 leaves the oxide 504' and the nitride layer 506' over the poly 508A. Additionally, a silicide layer 520 has been created in order to enhance electrical connections.

Figure 5C:
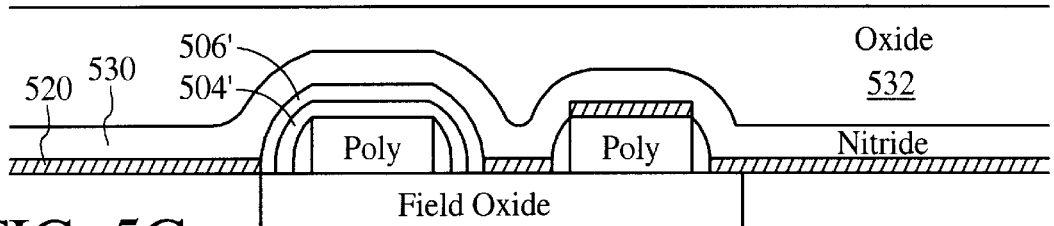

FIG. 5C shows the wafer of FIG. 5B after a second layer of nitride 530 and second layer of oxide 532 has been deposited upon the wafer.

Figure 5D:
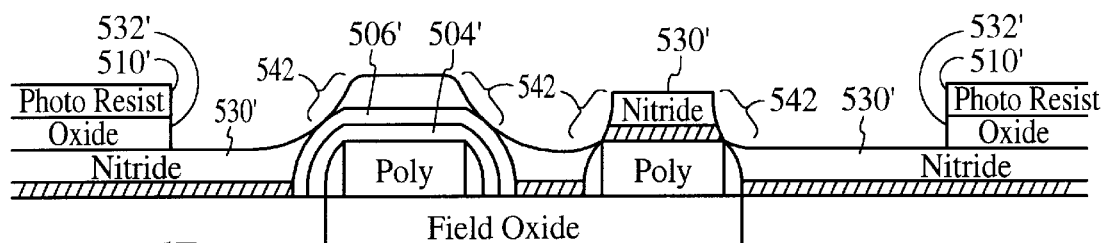

FIG. 5D shows the wafer of FIG. 5C during the etching of the second oxide layer 532 and the second nitride layer 530. FIG. 5D shows portion of the nitride layer 530' and oxide layer 532' being protected by photoresist material 510'. Additionally, it can be seen that areas 542 are being etched faster than other areas of the nitride layer due to the curvature of the layer in those areas. Note, however, that the second nitride layer 530 is being etched down to the first nitride layer 506' in the present invention rather than the first oxide layer 208" of the conventional method and system as shown in FIG. 2D. Since nitride etches approximately eight times slower than oxide, the first layer of nitride 506' should be enough to stop, or at least minimize, the etching of the thin first oxide layer 504'.

Figure 5E:
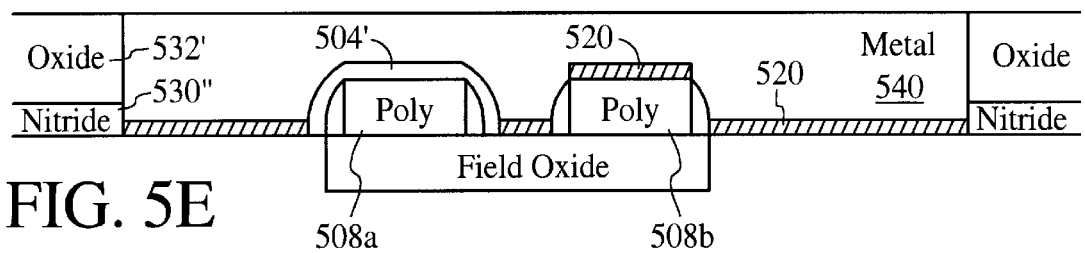

Consequently, the wafer shown in FIG. 5E shows poly 508A, which was intended not to be electrically connected, to have a thin layer of oxide insulation 504' to prevent the poly 508A from making electrical contact with the metal 540. When the metal 540, typically tungsten, is provided for electrical contact, the areas, such as poly 508B, which were intended to allow electrical contact, can have electrical contact while areas such as 508A, which is not intended to be part of the electrical connection, can be insulated.

Figure 6:
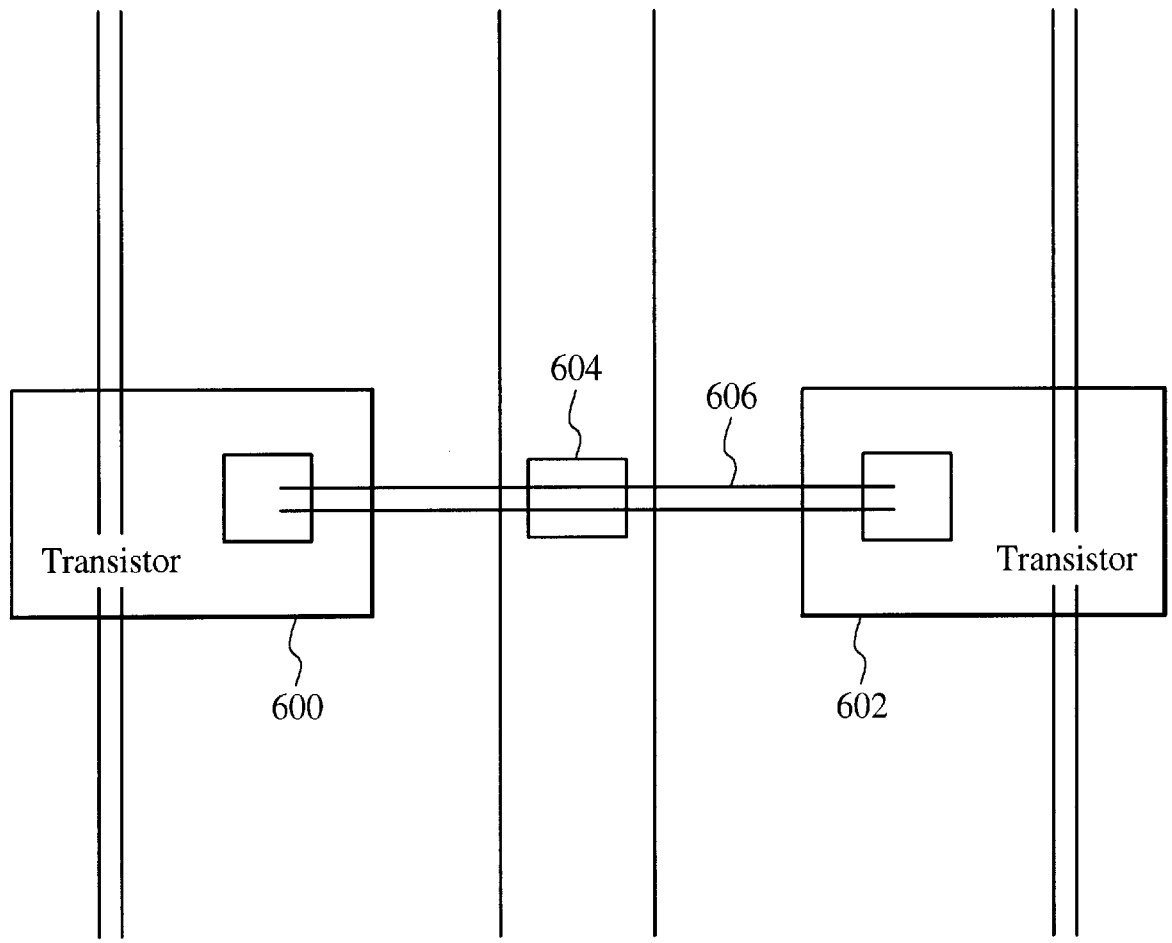
FIG. 6 illustrates a local interconnect according to the present invention.

FIG. 6 shows an electrical interconnect according to the present invention between two points of a logic circuit. If transistor 600 is desired to be electrically connected to transistor 602, then a direct connection can be made without the need for routing around an intervening obsticle.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing electrical insulation for local interconnects during manufacturing of a logic circuit comprising the steps of:

(a) providing a first layer of material over a semiconductor wafer and providing a second layer of material over the first layer;

(b) providing a photoresist material over a portion of the logic circuit to be electrically insulated;

(c) etching portions of the first and second layers which are unprotected by the photoresist material;

(d) providing at least a third layer over the first and second layers; and (e) etching the third layer such that the first layer has an electrical insulation over the portion of the logic circuit.

2. The method of claim 1, wherein the first layer includes oxide.

3. The method of claim 1, wherein the second layer includes nitride.

4. The method of claim 1, wherein the first layer has a thickness of approximately 200 angstroms to 1000 angstroms.

5. The method of claim 1, wherein the first layer has a thickness of approximately 200 angstroms.

6. The method of claim 1, wherein the second layer has a thickness of approximately 200 angstroms to 2000 angstroms.

7. The method of claim 1, wherein the second layer has a thickness of approximately 350 angstroms.

8. The method of claim 1, wherein the second layer includes silicon oxynitride.

9. The method of claim 1, further comprising step (f) of providing metal for electrical contact.

\* \* \* \* \*